(12) United States Patent
Walter et al.

(10) Patent No.: US 9,164,402 B2
(45) Date of Patent: Oct. 20, 2015

(54) METHOD OF OPERATING A MICROLITHOGRAPHIC PROJECTION EXPOSURE APPARATUS AND PROJECTION OBJECTIVE OF SUCH AN APPARATUS

(71) Applicant: Carl Zeiss SMT GmbH, Oberkochen (DE)

(72) Inventors: Holger Walter, Abtsgmuend (DE); Boris Bittner, Roth (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/327,919

(22) Filed: Jul. 10, 2014

(65) Prior Publication Data

US 2014/0327892 A1 Nov. 6, 2014

Related U.S. Application Data

(63) Continuation of application No. PCT/EP2012/000508, filed on Feb. 4, 2012.

(51) Int. Cl.
*G03B 27/52* (2006.01)
*G03B 27/54* (2006.01)
*G03F 7/20* (2006.01)
(Continued)

(52) U.S. Cl.
CPC ............ *G03F 7/70891* (2013.01); *G02B 7/028* (2013.01); *G02B 27/0068* (2013.01); *G03F 7/70266* (2013.01); *G03F 7/70308* (2013.01)

(58) Field of Classification Search
CPC .................................................. G03F 7/70308

USPC ........... 355/52, 53, 55, 67; 359/649, 665–666
See application file for complete search history.

(56) References Cited

U.S. PATENT DOCUMENTS

| 5,883,704 | A | 3/1999 | Nishi et al. |
| 6,338,823 | B1 | 1/2002 | Furukawa |
| 6,903,803 | B2 * | 6/2005 | Omura ............................ 355/67 |

(Continued)

FOREIGN PATENT DOCUMENTS

| WO | WO 2010/034674 | 4/2010 |
| WO | WO 2010/133231 | 11/2010 |

(Continued)

OTHER PUBLICATIONS

International Search Report for corresponding PCT Appl No. PCT/EP2012/00508, dated Apr. 9, 2014.

*Primary Examiner* — Hung Henry Nguyen
(74) *Attorney, Agent, or Firm* — Fish & Richardson P.C.

(57) ABSTRACT

A projection objective of a microlithographic projection exposure apparatus has a wavefront correction device including a first refractive optical element and a second refractive optical element. The first refractive optical element includes a first optical material having, for an operating wavelength of the apparatus, an index of refraction that decreases with increasing temperature. The second refractive optical element includes a second optical material having, for an operating wavelength of the apparatus, an index of refraction that increases with increasing temperature. In a correction mode of the correction device, a first heating device produces a non-uniform and variable first temperature distribution in the first optical material, and a second heating device produces a non-uniform and variable second temperature distribution in the second optical material.

20 Claims, 9 Drawing Sheets

(51) Int. Cl.
  *G02B 7/02* (2006.01)
  *G02B 27/00* (2006.01)

(56) References Cited

U.S. PATENT DOCUMENTS 7,830,611 B2 * 11/2010 Conradi et al. ............... 359/665

2009/0257032 A1 10/2009 Eva et al.
2010/0128367 A1 5/2010 Beckenbach et al.
2010/0201958 A1 8/2010 Hauf et al.

FOREIGN PATENT DOCUMENTS

| WO | WO 2011/116792 | 9/2011 |
| WO | WO 2013/044936 | 4/2013 |

* cited by examiner

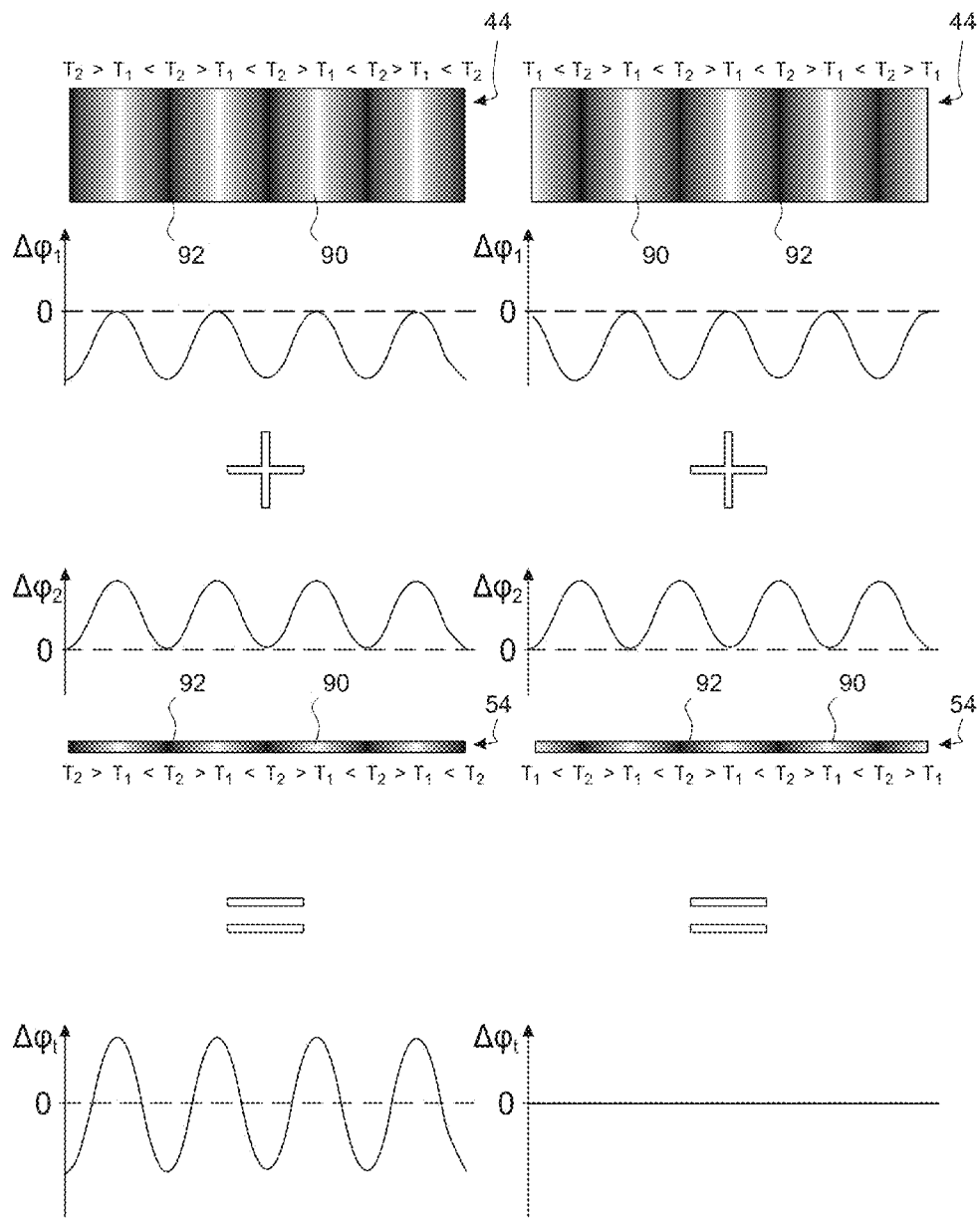

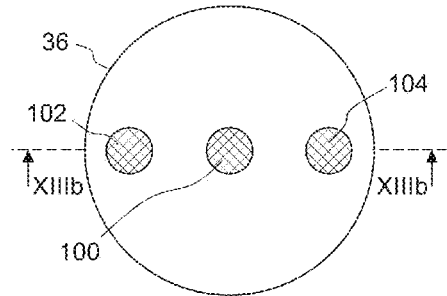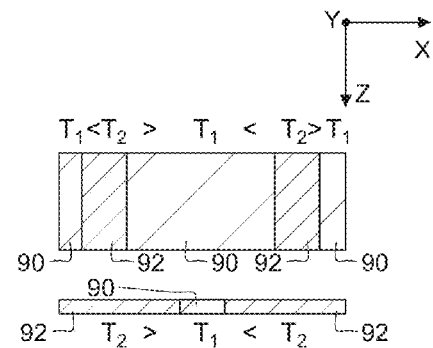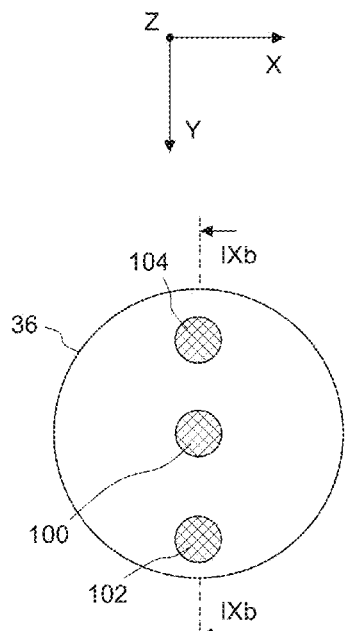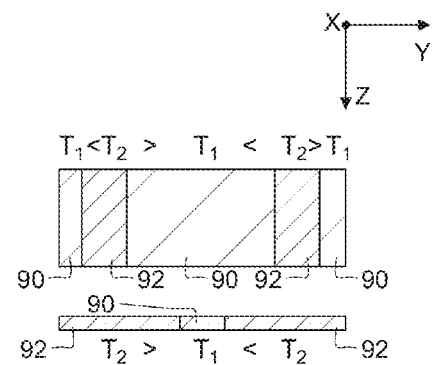
Fig. 8a  Fig. 8b
Fig. 9a  Fig. 9b

METHOD OF OPERATING A MICROLITHOGRAPHIC PROJECTION EXPOSURE APPARATUS AND PROJECTION OBJECTIVE OF SUCH AN APPARATUS

CROSS-REFERENCE TO RELATED APPLICATIONS

The present application is a continuation of, and claims benefit under 35 USC 120 to, international application PCT/EP2012/00508, filed Feb. 4, 2012. The entire disclosure of international application PCT/EP2012/00508 is incorporated by reference herein.

BACKGROUND OF THE INVENTION

1. Field of the Invention

The invention generally relates to a projection objective of a microlithographic projection exposure apparatus containing a wavefront correction device, and to a method of operating such an apparatus.

2. Description of Related Art

Microlithography (also referred to as photolithography or simply lithography) is a technology for the fabrication of integrated circuits, liquid crystal displays and other microstructured devices. The process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to radiation, such as deep ultraviolet (DUV), vacuum ultraviolet (VUV) or extreme ultraviolet (EUV) light. Next, the wafer with the photoresist on top is exposed to projection light through a mask in a projection exposure apparatus. The mask contains a circuit pattern to be projected onto the photoresist. After exposure the photoresist is developed to produce an image corresponding to the circuit pattern contained in the mask. Then an etch process transfers the circuit pattern into the thin film stacks on the wafer. Finally, the photoresist is removed. Repetition of this process with different masks results in a multi-layered microstructured component.

A projection exposure apparatus typically includes an illumination system, a mask alignment stage for aligning the mask, a projection objective and a wafer alignment stage for aligning the wafer coated with the photoresist. The illumination system illuminates a field on the mask that may have the shape of a rectangular slit or a narrow ring segment, for example.

In current projection exposure apparatus a distinction can be made between two different types of apparatus. In one type each target portion on the wafer is irradiated by exposing the entire mask pattern onto the target portion in one go; such an apparatus is commonly referred to as a wafer stepper. In the other type of apparatus, which is commonly referred to as a step-and-scan apparatus or simply scanner, each target portion is irradiated by progressively scanning the mask pattern under the projection light beam in a given reference direction while synchronously scanning the substrate parallel or anti-parallel to this direction. The ratio of the velocity of the wafer and the velocity of the mask is equal to the magnification $\beta$ of the projection lens. A typical value for the magnification is $\beta = \pm \frac{1}{4}$.

It is to be understood that the term "mask" (or reticle) is to be interpreted broadly as a patterning device. Commonly used masks contain opaque, transparent or reflective patterns and may be of the binary, alternating phase-shift, attenuated phase-shift or various hybrid mask type, for example.

One of the essential aims in the development of projection exposure apparatus is to be able to lithographically produce structures with smaller and smaller dimensions on the wafer. Small structures lead to high integration densities, which generally has a favorable effect on the performance of the microstructured components produced with the aid of such apparatus. Furthermore, the more devices can be produced on a single wafer, the higher is the throughput of the production process.

The size of the structures that can be generated depends primarily on the resolution of the projection objective being used. Since the resolution of projection objectives is inversely proportional to the wavelength of the projection light, one way of increasing the resolution is to use projection light with shorter and shorter wavelengths. The shortest wavelengths currently used are 248 nm, 193 nm or 157 nm and thus lie in the deep or vacuum ultraviolet spectral range. Also apparatus using EUV light having a wavelength of about 13 nm are meanwhile commercially available. Future apparatus will probably use EUV light having a wavelength as low as 6.9 nm.

The correction of aberrations (i.e. image errors) is becoming increasingly important for projection objectives with very high resolution. Different types of aberrations usually require different correction measures.

The correction of rotationally symmetric aberrations is comparatively straightforward. An aberration is referred to as being rotationally symmetric if the wavefront deformation in the exit pupil of the projection objective is rotationally symmetric. The term wavefront deformation denotes the deviation of an optical wave from the ideal aberration-free wave. Rotationally symmetric aberrations can be corrected, for example, at least partially by moving individual optical elements along the optical axis.

Correction of aberrations that are not rotationally symmetric is more difficult. Such aberrations occur, for example, because lenses and other optical elements heat up rotationally asymmetrically. One aberration of this type is astigmatism.

A major cause for rotationally asymmetric aberrations is a rotationally asymmetric, in particular slit-shaped, illumination of the mask, as it is typically encountered in projection exposure apparatus of the scanner type. The slit-shaped illuminated field causes a non-uniform heating of those optical elements that are arranged in the vicinity of field planes. This heating results in deformations of the optical elements and, in the case of lenses and other elements of the refractive type, in changes of their refractive index. If the materials of refractive optical elements are repeatedly exposed to the high energetic projection light, also permanent material changes are observed. For example, a compaction of the materials exposed to the projection light may occur, and this compaction results in permanent local changes of the refractive index. In the case of mirrors the reflective multi-layer coatings may be damaged by the high local light intensities so that the reflectance is locally altered.

The heat induced deformations, index changes and coating damages alter the optical properties of the optical elements and thus cause aberrations. Heat induced aberrations sometimes have a twofold symmetry. However, aberrations with other symmetries, for example threefold or fivefold, are also frequently observed in projection objectives.

Another major cause for rotationally asymmetric aberrations are certain asymmetric illumination settings in which the pupil plane of the illumination system is illuminated in a rotationally asymmetric manner. Important examples for such settings are dipole settings in which only two poles are illuminated in the pupil plane. With such a dipole setting, also the pupil planes in the projection objective contain two strongly illuminated regions. Consequently, lenses or mirrors arranged in or in the vicinity of such an objective pupil plane are exposed to a rotationally asymmetric intensity distribution which gives rise to rotationally asymmetric aberrations. Also quadrupole settings sometimes produce rotationally asymmetric aberrations, although to a lesser extent than dipole settings.

In order to correct rotationally asymmetric aberrations, U.S. Pat. No. 6,338,823 B1 proposes a lens which can be selectively deformed with the aid of a plurality of actuators distributed along the circumference of the lens. The deformation of the lens is determined such that heat induced aberrations are at least partially corrected. A more complex type of such a wavefront correction device is described in US 2010/0128367 A1.

U.S. Pat. No. 7,830,611 B2 discloses a similar wavefront correction device. In this device one surface of a deformable plate contacts an index matched liquid. If the plate is deformed, the deformation of the surface adjacent the liquid has virtually no optical effect. Thus this device makes it possible to obtain correcting contributions from the deformation not of two, but of only one optical surface. A partial compensation of the correction effect, as it is observed if two surfaces are deformed simultaneously, is thus prevented.

However, the deformation of optical elements with the help of actuators has also some drawbacks. If the actuators are arranged at the circumference of a plate or a lens, it is possible to produce only a restricted variety of deformations with the help of the actuators. This is due to the fact that both the number and also the arrangement of the actuators are fixed. In particular it is usually difficult or even impossible to produce deformations which may be described by higher order Zernike polynomials, such as $Z_{10}$, $Z_{36}$, $Z_{40}$ or $Z_{64}$.

US 2010/0201958 A1 and US 2009/0257032 A1 disclose a wavefront correction device that comprises a refractive optical element formed as a plate. In contrast to the device described in the aforementioned U.S. Pat. No. 7,830,611 B2, a wavefront correction is not produced by deforming the plate, but by changing its refractive index locally. To this end the plate is provided with thin heating wires that extend over one of its surfaces. With the help of the heating wires a temperature distribution inside the plate can be produced that results, via the dependency dn/dT of the refractive index n on the temperature T, in the desired refractive index distribution.

In one embodiment of this known wavefront correction device the plate is made of fused silica (i.e. quartz glass, $SiO_2$). This element is attached to a second thicker refractive optical element that is made of $CaF_2$ (fluorite). Since in fused silica the index of refraction increases with increasing temperature, while in $CaF_2$ the index of refraction decreases with increasing temperature, phase variations induced by the two materials compensate each other outside a region which is covered by the heating element.

Although even higher order wavefront deformations can be corrected very well with this known wavefront correction device, it is difficult to quickly change the corrective effect.

WO 2011/116792 A1 discloses a wavefront correction device in which a plurality of fluid flows emerging from outlet apertures enter a space through which projection light propagates during operation of the projection exposure apparatus. A temperature controller sets the temperature of the fluid flows individually for each fluid flow. The temperature distribution is determined such that optical path length differences caused by the temperature distribution correct wavefront deformations.

From the unpublished international patent application PCT/EP2011/004859 (Zellner et al) a wavefront correction device is known in which a plurality of heating light beams are directed towards a circumferential rim surface of a refractive optical element. After entering the refractive optical element, the heating light beams are partially absorbed inside the element. In this manner almost any arbitrary temperature distribution can be produced inside the refractive optical element, but without a need to arrange heating wires in the projection light path that absorb, reflect, diffract and/or scatter projection light to an albeit small, but not negligible extent.

U.S. Pat. No. 5,883,704 discloses a projection objective in which a lens made of $CaF_2$ is heated with the help of a gas flow that flows over one of the lens surfaces. In order to prevent that lenses made of fused silica arranged on both sides of the heated $CaF_2$ lens are also heated, these lenses are kept at a constant temperature with the help of a constant temperature gas which flows over at least one surface of the adjacent lenses.

SUMMARY OF THE INVENTION

It is an object of the present invention to provide a method of operating a microlithographic projection exposure apparatus and a projection objective of such an apparatus which make it possible, in order to correct an optical wavefront deformation, to quickly change between different phase variations and to produce phase variations with high spatial frequencies.

With respect to the method, this object is solved by a method comprising the following steps:

a) providing a projection exposure apparatus comprising a projection objective that contains a wavefront correction device, the device comprising:
  a first refractive optical element that comprises a first optical material having, for an operating wavelength of the apparatus, an index of refraction that decreases with increasing temperature,
  a second refractive optical element that comprises a second optical material having, for the operating wavelength of the apparatus, an index of refraction that increases with increasing temperature, b) determining an aberration of the projection objective by measurement and/or simulation;

c) determining, by taking into account the aberration determined in step b), a first phase variation and a second phase variation, wherein, if the first phase variation is generated by the first refractive optical element and the second phase variation is generated by the second refractive optical element, the aberration determined in step b) is modified;

d) generating the first phase variation by changing a temperature distribution in the first optical material using a first heating device;

e) generating the second phase variation by changing a temperature distribution in the second optical material using a second heating device that is distinct and independent from the first heating device.

The combination of two optical materials having an opposite dependency dn/dT of the index of refraction n on the temperature T makes it possible to quickly change between phase variations having high spatial frequencies. The quick response time, i.e. the time which is required to change from one phase variation distribution to another one, is associated with two different aspects.

One aspect is related to the fact that—particular in the case of certain illumination settings—projection light is often concentrated in very small portions of the lenses contained in the projection objective. Although lens materials having a very low coefficient of absorption are used, these portions heat up considerably due to the permanent impact of the high energy projection light. Since usual lens materials such as fused silica ($SiO_2$) have a positive dn/dT, the local temperature increase is associated with a local increase of the index of refraction n, and this, in turn, causes locally retarded wavefronts.

Since the first refractive optical element has a negative dn/dT, it is possible to heat up equally small portions of the element in order to compensate the retardance introduced by the lenses. Then the locally decreased index of refraction in the first refractive optical element offsets the effect produced by the locally increased index of refraction in the lenses. Heating only small portions of the refractive optical element implies the generation of less heat in total. This helps to shorten the response time, because a small amount of heat dissipates quicker than a large amount of heat.

The second aspect is related to the large thermal conductivity that is observed for many of those optical materials that have a negative dn/dT and are suitable for being employed in projection exposure apparatus. For wavelengths that are typically used in projection exposure apparatus, for example 193 nm and 248 nm, fluorite ($CaF_2$) and similar crystalline materials such as barium fluoride ($BaF_2$), strontium fluoride ($SrF_2$) and mixed crystalline materials such as $Ca_{1-x}Ba_xF_2$ have a negative dn/dT. These crystalline materials have a significantly higher thermal conductivity than fused silica which is usually used as optical material for lenses. Usually it is more difficult to establish a stable temperature distribution in materials having a large thermal conductivity, because the heat "flows away" quickly. On the other hand, a large thermal conductivity of a refractive optical element implies that the temperature distribution can be changed more quickly if compared to a refractive optical element having the same shape and size, but having a smaller thermal conductivity.

Thus the first refractive optical element having the negative dn/dT may primarily perform the task of quickly changing the phase variation distribution, whereas the second refractive optical element having a positive dn/dT generates phase variation distributions that do not vary quickly during the operation of the apparatus. Since fused silica and other optical materials having a positive dn/dT are often very sensible to temperature changes, i.e. have a large absolute value of dn/dT, the second refractive optical element may then, so to say, take over the base load of the correction need, thereby requiring only a small amount of added heat due to the large dn/dT.

It should be noted in this context that the term "aberration" is to be understood very broadly in the context of the present invention. An aberration denotes any deviation of an optical wavefront from an ideal optical wavefront that results, for a particular mask, in the best possible image.

If the ideal wavefront in a pupil plane is perfectly planar, the aberration is a conventional image error such as astigmatism or distortion or a combination thereof.

However, in projection objectives and other diffraction limited optical systems the ideal wavefront in a pupil plane may not be planar. Image enhancement technologies have been developed to compute, for a given object to be imaged, an ideal non-planar wavefront that results in the best possible image in the presence of diffraction. An aberration as understood in the present invention then describes the difference between a real optical wavefront and such an ideal non-planar wavefront that has been determined by image enhancement technologies.

Also the determination of aberrations in step b) is to be understood broadly, too. It encompasses not only the determination of conventional image errors, but also the determination of deviations of a real optical wavefront from an ideal non-planar wavefront that has been computed using image enhancement technologies.

Similarly, a "correction" of an aberration or of an optical wavefront does not necessarily imply that a wavefront deformation is reduced or even completely removed. Even in the case of conventional image errors it is sometimes better to transform a rotationally asymmetric wavefront deformation into a rotationally symmetric wavefront deformation that is equally "strong" or even "stronger", but can be reduced more easily with other approaches such as a displacement of certain lenses along the optical axis.

If image enhancement technologies are employed so that the ideal optical wavefront is non-planar, the correction of an aberration as understood here necessarily does not result in a planar optical wavefront.

After step b) a first temperature distribution will be obtained in the first optical material, and after step e) a second temperature distribution will be obtained in the second optical material. Generally both the first temperature distribution and the second temperature distribution are non-uniform. In particular, the first temperature distribution and the second temperature distribution may both be described by a superposition of Zernike polynomials containing at least one term $Z_i$ with $i \geq 5$. Then also wavefront deformations with a high spatial frequency can be successfully symmetrized, reduced or, in the case of image enhancement technologies, produced.

Generally the first temperature distribution differs from the second temperature distribution. In particular, the first temperature distribution may be at least substantially complementary to the second temperature distribution. This makes it possible to produce, due to the opposite dn/dT of the first and second optical material, phase variations with large gradients and high amplitudes. A complementary temperature distribution in the first and second refractive optical element may imply that a light ray that passes through a point in the first material, where the temperature is maximum, passes through a point in the second material where the temperature is minimum, and vice versa.

In some embodiments the first refractive optical element is arranged immediately adjacent to the second refractive optical element. In that case it may be necessary to thermally isolate the two refractive optical elements from each other.

This can be achieved if an at least substantially laminar fluid flow is guided through an interspace that is delimited by the first refractive optical element and the second refractive optical element. The laminar fluid flow then thermally insulates the two refractive optical elements and may be additionally be used to cool the refractive optical elements by forming a common heat sink. A liquid such as pure water or a gas such as air or nitrogen may be used as fluid for that purpose.

If the first and second refractive optical elements are spaced apart by a sufficient distance, such a fluid flow may be dispensed with.

For example, at least one lens or another solid optical element may be arranged between the first refractive optical element and the second refractive optical element. Such a spatially separated arrangement of the refractive optical elements may be advantageous with the view to space requirements, and it also eliminates the need to thermally isolate the two refractive optical elements from each other. If the phase variations generated by the two refractive optical elements shall simply combine, the first refractive optical element should be arranged at a position that is at least substantially optically conjugate to a position where the second refractive optical element is arranged.

This may imply that a paraxial sub-aperture ratio at a position, where the first refractive optical element is arranged, is between 0.8 and 1.2 times a paraxial sub-aperture ratio at a position where the second refractive optical element is arranged. The paraxial sub-aperture ratio is defined in the aforementioned US 2009/0257032 A1.

With respect to the projection objective, the above stated problem is solved by a projection objective comprising a wavefront correction device which comprises:

a) a first refractive optical element that comprises a first optical material having, for an operating wavelength of the apparatus, an index of refraction that decreases with increasing temperature, b) a second refractive optical element that comprises a second optical material having, for the operating wavelength of the apparatus, an index of refraction that increases with increasing temperature, c) a first heating device which is configured to produce, in a correction mode of the correction device, a non-uniform and variable first temperature distribution in the first optical material, d) a second heating device which is configured to produce, in a correction mode of the correction device, a non-uniform and variable second temperature distribution in the second first optical material.

The considerations and advantages explained above with reference to the method of operation apply here, mutatis mutandis, as well.

If the first heating device and the second heating device each comprises a plurality of heating elements that are configured to be individually controlled by a control unit, each heating element of at least one heating device may comprise an electric heat dissipating member which may contact the refractive optical element that is associated with the at least one heating device. Such an electric heat dissipating member may be formed by a resistance wire, for example.

Alternatively, each heating element of at least one heating device may comprise a heating light source, for example an LED or a laser diode. Possible configurations of such heating devices are disclosed in the aforementioned unpublished international patent application PCT/EP2011/004859 (Zellner et al).

In particular, the heating light source may be configured to direct a heating light beam on the refractive optical element that is associated with the at least one heating device.

In one embodiment the wavefront correction device comprises a computing unit which is configured to determine a target phase variation for an optical wavefront passing through the correction device. The target phase variation is the sum of a first phase variation and a second phase variation. The first temperature distribution generates the first phase variation if projection light passes through the first refractive optical element, and the second temperature distribution generates the second phase variation if projection light passes through the second refractive optical element.

Generally the refractive optical elements may have any arbitrary shape. In particular, the elements may be formed by lenses having a positive or negative refractive power, or by plates so that they have plane and parallel surfaces.

In a still further embodiment the first refractive optical element is a plate having a uniform thickness $d_1$, and the second refractive optical element is a plate having a uniform thickness $d_2$. The index of refraction $n_1$ of the first optical material decreases, for the operating wavelength of the apparatus and a temperature range between 20° and 100°, with increasing temperature T by $dn_1/dT$. The index of refraction $n_2$ of the second optical material increases, for the operating wavelength of the apparatus in the temperature range between 20° and 100°, with increasing temperature T by $dn_2/dT$. If the condition $(-dn_1/dT)/(dn_2/dT)=k \cdot d_2/d_1$, with $0.9<k<1.1$, and preferably $k=1$, applies, an identical temperature change $\Delta T$ in both plates generate at least substantially the same phase variation, but with opposite signs, in the two plates. For example, if the first refractive optical element is made of $CaF_2$ and the second refractive optical element is made of $SiO_2$, the first refractive optical element may be between 6.1 and 7.3 times thicker than the second refractive optical element.

DEFINITIONS

The term "light" denotes any electromagnetic radiation, in particular visible light, UV, DUV and VUV light.

The term "operating wavelength" is used herein to denote the wavelength, or strictly speaking a center wavelength of a narrow range of wavelengths, for which the projection exposure apparatus is designed.

The term "light ray" is used herein to denote light whose path of propagation can be described by a line.

The term "light beam" is used herein to denote a plurality of light rays. A light beam usually has an irradiance profile across its diameter that may vary along the propagation path. A single light beam can usually be associated with a single point or extended light source.

The term "surface" is used herein to denote any planar or curved surface in the three-dimensional space. The surface may be part of a body or may be completely separated therefrom.

The term "refractive optical element" is used herein to denote an optical element that is transparent at least for the projection light. Furthermore, the element has at least one optical surface through which the projection light enters the element. Usually the projection light will be refracted at this optical surface.

The term "optically conjugate" is used herein to denote an imaging relationship between two points or two surfaces. Imaging relationship means that a light bundle emerging from a point converges at the optically conjugate point.

The term "field plane" is used herein to denote a plane that is optically conjugate to the mask plane.

The term "pupil plane" is used herein to denote a plane in which all light rays, which converge or diverge under the same angle in a field plane, pass through the same point. As usual in the art, the term "pupil plane" is also used if it is in fact not a plane in the mathematical sense, but is slightly curved so that, in a strict sense, it should be referred to as pupil surface.

BRIEF DESCRIPTION OF THE DRAWINGS

Various features and advantages of the present invention may be more readily understood with reference to the following detailed description taken in conjunction with the accompanying drawings in which:

FIGS. 6a and 6b schematically illustrate exemplary periodic temperature distributions in the two correction plates as well as generated phase variations at two different times, respectively;

FIG. 8a illustrates the irradiance distribution in a pupil plane for a first illumination setting;

FIG. 8b illustrates the temperature distributions in the two correction plates for correcting aberrations that are associated with the illumination setting illustrated in FIG. 8a;

FIG. 9a illustrates the irradiance distribution in a pupil plane for a second illumination setting;

FIG. 9b illustrates the temperature distributions in the two correction plates for correcting aberrations that are associated with the illumination setting illustrated in FIG. 9a;

DESCRIPTION OF PREFERRED EMBODIMENTS

I. General Construction of Projection Exposure Apparatus

Figure 1:
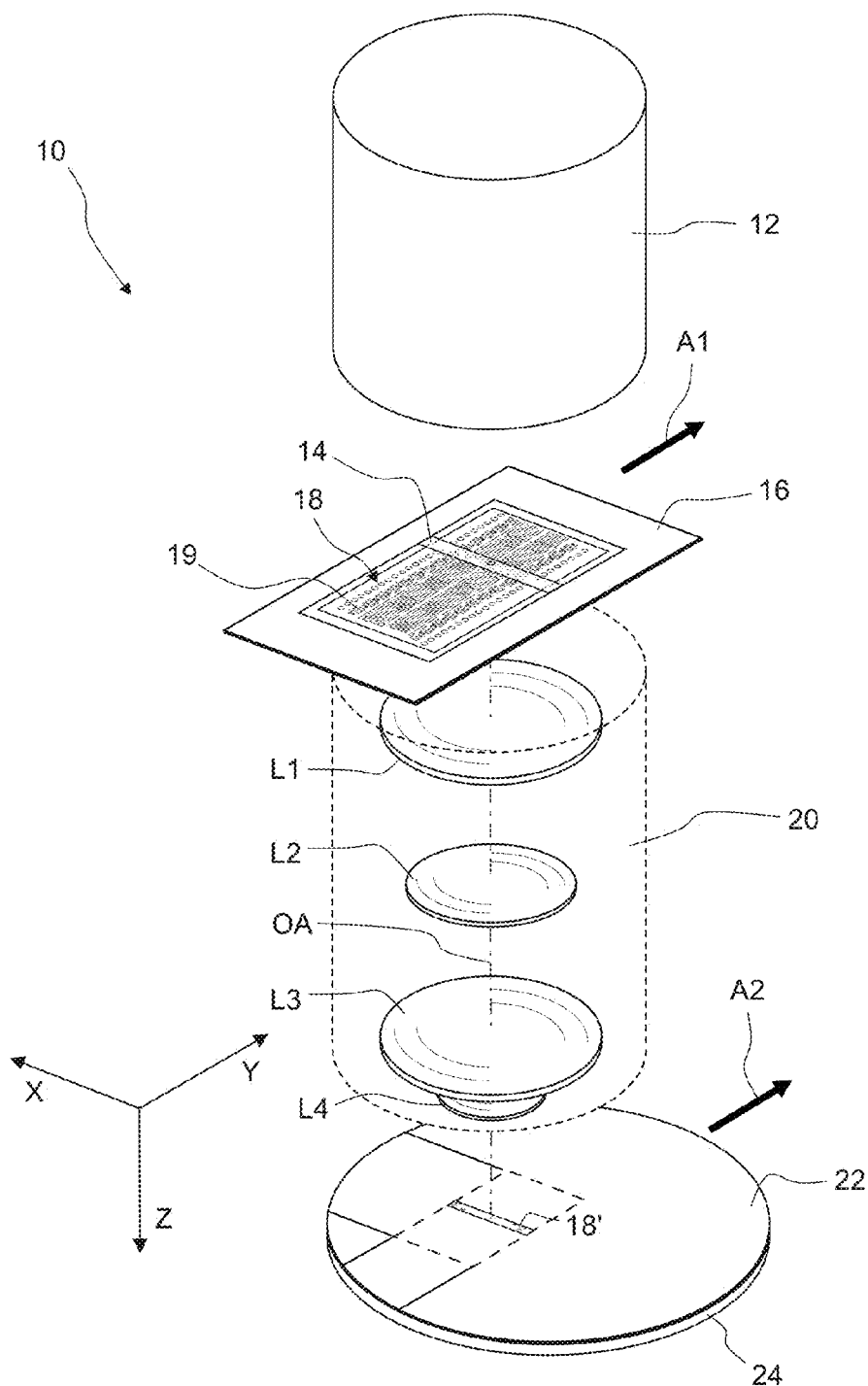
FIG. 1 is a schematic perspective view of a projection exposure apparatus in accordance with the present invention.

FIG. 1 is a perspective and highly simplified view of a projection exposure apparatus 10 in accordance with the present invention. The apparatus 10 comprises an illumination system 12 which produces projection light having a central wavelength of 193 nm which is referred to in the following as operating wavelength of the apparatus 10. The projection light illuminates a field 14 on a mask 16 containing a pattern 18 of fine features 19. In this embodiment the illuminated field 14 has a rectangular shape. However, other shapes of the illuminated field 14, for example ring segments, and also other operating wavelengths, for example 157 nm or 248 nm, are contemplated as well.

A projection objective 20 having an optical axis OA and containing a plurality of lenses L1 to L4 images the pattern 18 within the illuminated field 14 onto a light sensitive layer 22, for example a photoresist, which is supported by a substrate 24. The substrate 24, which may comprise a silicon wafer, is arranged on a wafer stage (not shown in FIG. 1) such that a top surface of the light sensitive layer 22 is precisely located in an image plane of the projection objective 20. The mask 16 is positioned via a mask stage (not shown in FIG. 1) in an object plane of the projection objective 20. Since the latter has a magnification $\beta$ with $|\beta|<1$, a minified image 18' of the pattern 18 within the illuminated field 14 is projected onto the light sensitive layer 22.

During the projection the mask 16 and the substrate 24 move along a scan direction which corresponds to the Y direction indicated in FIG. 1. The illuminated field 14 then scans over the mask 16 so that patterned areas larger than the illuminated field 14 can be continuously imaged. The ratio between the velocities of the substrate 24 and the mask 16 is equal to the magnification $\beta$ of the projection objective 20. If the projection objective 20 does not invert the image ($\beta>0$), the mask 16 and the substrate 24 move along the same direction, as this is indicated in FIG. 1 by arrows A1 and A2. However, the present invention may also be used with catadioptric projection objectives 20 having off-axis object and image fields.

Figure 2:
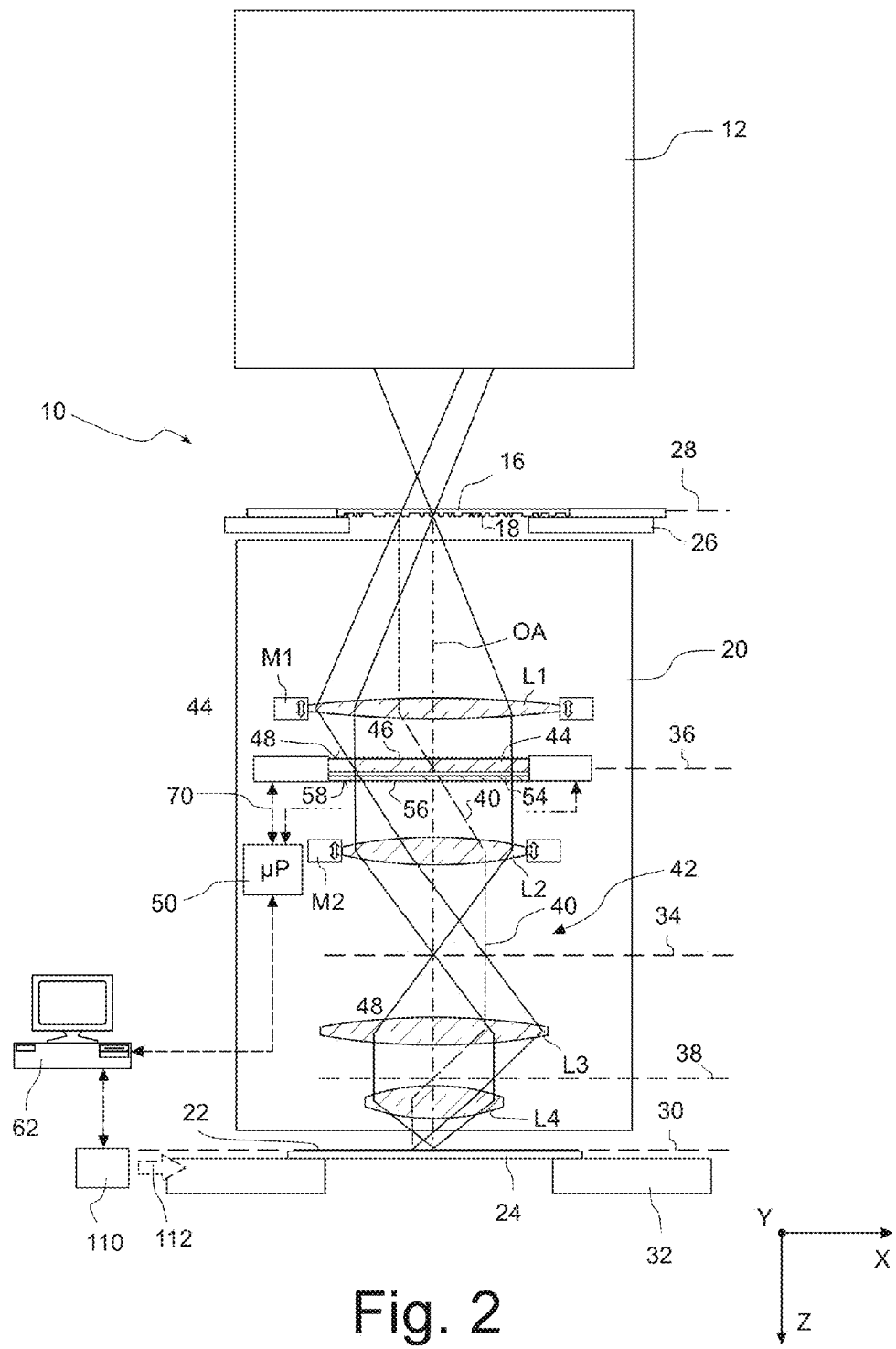
FIG. 2 is schematic meridional section through the apparatus shown in FIG. 1.

FIG. 2 is a schematic meridional section through the apparatus 10 shown in FIG. 1. In this section also a mask stage 26, which supports and moves the mask 16 in an object plane 28 of the projection objective 20, and a wafer stage 32, which supports and moves the substrate 24 in an image plane 30 of the projection objective 20, are shown.

Inside the projection objective 20 two manipulators M1 and M2 are arranged that are configured to individually displace the lenses L1 and L2, respectively, along an optical axis OA of the projection objective 20.

In this embodiment the projection objective 20 has an intermediate image plane 34. The image of the features 18 formed in the intermediate image plane may be substantially blurred and/or distorted as a result of various aberrations. In particular, the intermediate image plane 34 may be strongly curved.

A first pupil plane 36 is located between the object plane 28 and the intermediate image plane 34, and a second pupil plane 38 is located between the intermediate image plane 34 and the image plane 30 of the projection objective 20. In the first and second pupil plane 36, 38 all light rays converging or diverging under the same angle from any of the field planes, i.e. the object plane 28, the intermediate image plane 34 and the image plane 30, pass through the same point, as this is illustrated in FIG. 2. This implies that all light rays intersecting a field plane parallel to the optical axis OA, such as light ray 40 indicated as a broken line, intersect the optical axis OA in the first and second pupil plane 36, 38.

In the first pupil plane 36 a wavefront correction device 42 for correcting wavefront deformations is arranged. This device will be described in more detail below in the following section.

II. Wavefront Correction Device

Referring again to FIG. 2, the wavefront correction device 42 comprises a first refractive optical element which is formed in this embodiment by a first correction plate 44 having a square circumference and a uniform thickness. The first correction plate 44 consists of a first optical material having an index of refraction $n_1$ that decreases with increasing temperature T. In this embodiment fluorite ($CaF_2$) is used as the material for the first correction plate 44. Fluorite has, for the operating wavelength of 193 nm, a dependency $dn_1/dT$ of the index of refraction $n_1$ on the temperature T which is about $-2.9 \cdot 10^{-6} K^{-1}$.

A first heating device formed by a regular grid of resistance wires 46 or other electric heat dissipating members is attached to an upper surface 48 of the first correction plate 44 pointing towards the object plane 28 of the projection objective 20. Electrical voltages can be applied to the resistance wires 46 individually by a control unit 50 so that a wide variety of different temperature distributions can be produced in the first correction plate 44.

Due to the dependency of $dn_1/dT$ of the refractive index $n_1$ on the temperature T, the temperature distribution produced by the resistance wires 46 is associated with a refractive index distribution inside the first correction plate 44. The latter, in turn, generates, if the temperature T changes by $\Delta T$, a first phase variation $\Delta \phi_1 = s \cdot \Delta T \cdot dn_1/dT$, wherein s is the distance along which the projection light passes through the optical material where the temperature change occurs. The phase variation $\Delta \phi_1$ can be used to correct, or more generally to modify, the optical wavefront of the projection light in a manner that will be explained in more detail below.

The correction device 42 further comprises a second refractive optical element which is formed by a second correction plate 54. The second correction plate 54 has generally the same constitution as the first correction plate 44, i.e. it supports a second heating device formed by a regular grid of resistance wires 56 on a lower surface 58 of the second correction plate 54 pointing towards the image plane 30 of the projection objective 20. However, the second correction plate 54 comprises an optical material which has, for the operating wavelength of the projection light, an index of refraction $n_2$ that does not decrease, but increases with increasing temperature T. In this embodiment fused silica ($SiO_2$) is used as optical material for the second correction plate 54. For the operating wavelength of 193 nm the temperature dependency $dn_2/dT$ is approximately $19.4 \cdot 10^{-6} K^{-1}$.

Thus the temperature dependency of the refractive index $dn_2/dT$ of the second correction plate 54 has not only an opposite sign, but also a different absolute value in comparison with the temperature dependency $dn_1/dT$ of the first correction plate 44. In this embodiment the absolute value of the temperature dependency of the first correction plate 44 is about 6.7 times smaller than the corresponding value of the second correction plate 54. Accordingly, the thicknesses of the correction plates 44, 54 are selected such that the first correction plate 44 is about 6.7 times thicker than the second correction plate 54. Then a temperature change $\Delta T$ will produce in both correction plates 44, 54 phase variations $\Delta \phi_1$, $\Delta \phi_2$ having the same absolute value, but opposite signs, i.e. $\Delta \phi_1 \approx -\Delta \phi_2$.

Therefore, if identical temperature variations were produced in the correction plates 44, 54, the generated phase variations would completely compensate each other so that the wavefronts of the projection light would not be affected at all. As it will be described in the following section III, the benefit of combining the two correction plates 44, 54 having a dn/dT with opposite signs becomes apparent only if a sophisticated control scheme is applied to the heating devices that are associated with the correction plates 44, 54.

Figure 3:
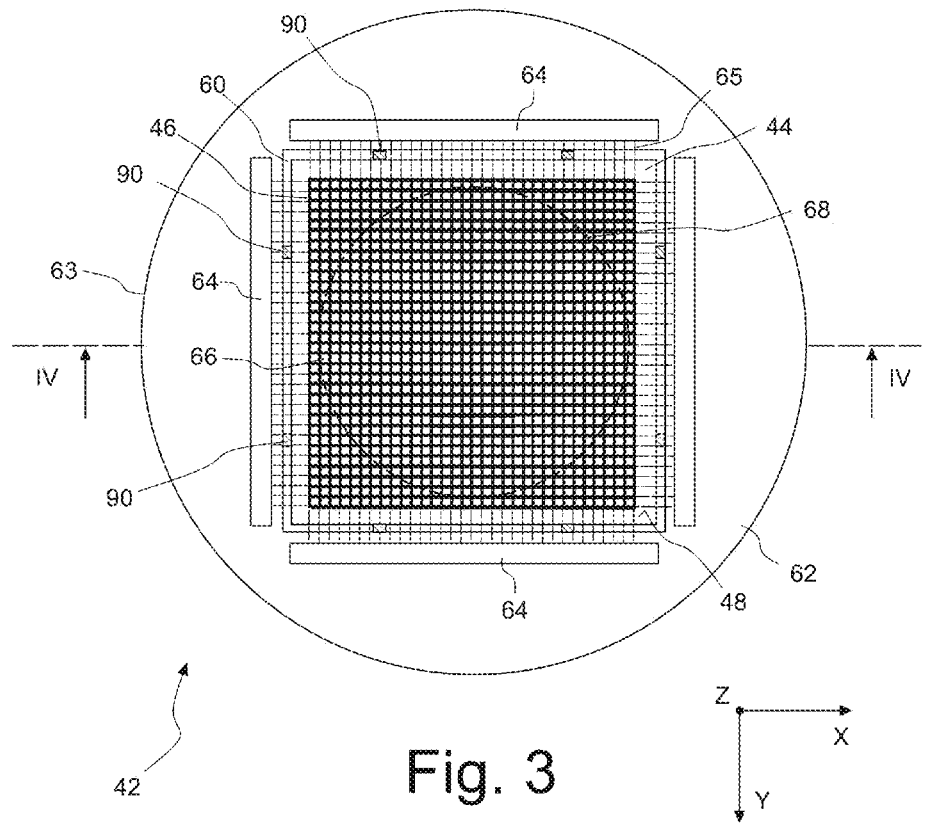
FIG. 3 is a top view on a wavefront correction device according to a first embodiment of the invention that is contained in a projection objective being part of the apparatus shown in FIGS. 1 and 2.
Figure 4:
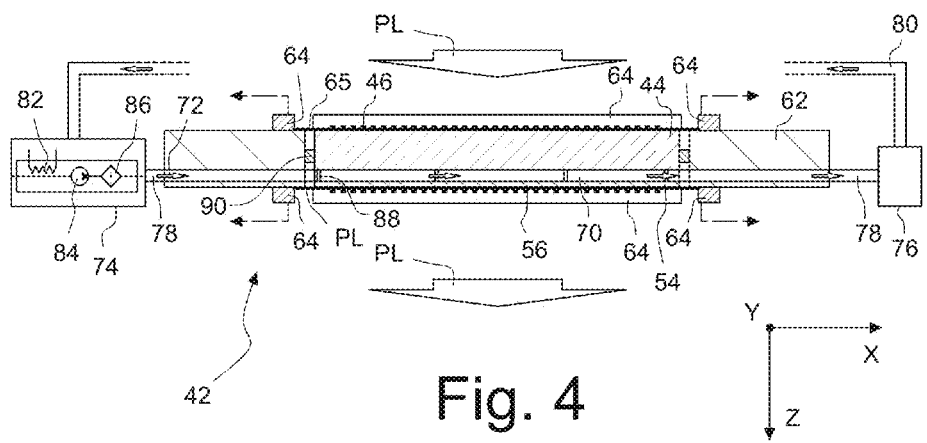
FIG. 4 is a sectional view through the wavefront correction device shown in FIG. 3 along line IV-IV.

FIGS. 3 and 4 illustrate schematically some constructional details of the correction device 42 in a top view and a sectional view along line IV-IV, respectively.

In the top view of FIG. 3 it can be seen that the first correction plate 44 is accommodated in a central square recess 60 that is provided in a support frame 62 having a circular circumference 63. An upper surface of the support frame 62 supports electronic circuit boards 64 which apply, via flexible leads 65 indicated with broken lines, variable voltages to the resistance wires 46 that are attached to the upper surface 48 of the first correction plate 44. In a manner that is not shown in detail, it is possible to electrically generate heat within each square surface element 66 which is defined by pairs of orthogonal resistance wires 46. To this end diode circuits and time multiplexing control schemes may be used. More details with regard to the layout and control of the heating devices for the correction plates 44, 54 can be gleaned from US 2010/0201958 A1 that has been mentioned further above.

A maximum area through which projection light is allowed to pass through the first pupil plane 36 is indicated in FIG. 3 by a broken circle 68.

As it can be seen in the cross section of FIG. 4, the second correction plate 54 is received in the recess 60 in a similar manner. Electric circuit boards 64 that apply voltages to the resistance wires 56 attached to the lower surface 58 of the second correction plate 54 are supported on an opposite surface of the support frame 62.

The two correction plates 44, 54 are not in contact to each other, but are separated by an interspace. Since the refractive optical elements are formed as plane correction plates 44, 54 in this embodiment, the interspace has the shape of a gap 70 having a uniform thickness. An at least substantially laminar fluid flow indicated by arrows 72 is guided through the gap 70. To this end a fluid supply unit 74 and a collector unit 76 are connected via channels 78 to opposite sides of the gap 70. The fluid supply unit 74 and the collector unit 76 produce and collect the fluid flow 72, respectively. Via a return line 80 the fluid collected by the collector unit 78 is returned to the supply unit 76 so that the fluid is constantly recirculated.

The fluid supply unit 76 comprises in this embodiment a heat exchanger 82, a circulation pump 84 and a filter 86. The temperature set by the fluid supply unit 76 is determined by the control unit 50 such that the total net heat balance of the correction device 42 is kept constant. On other words, the total amount of heat produced by the resistance wires 46 on the correction plates 44, 54 is approximately equal to the heat which is removed from the correction plates 44, 54 by the fluid flow 72.

Furthermore, the fluid flow 72 helps to thermally isolate the first and second correction plates 44, 54 from each other. This makes it possible, in spite of the small distance between the correction plates 44, 54, to produce different and independent temperature distributions inside the first and second correction plates 44, 54. Thus a temperature distribution produced in the first correction plate 44 with the help of the first resistance wires 46 is substantially independent of the temperature distribution produced by the second resistance wires 56 in the second correction plate 54. This independence of the temperature distributions is important for the correction device 42 because it makes it possible to achieve a corrective effect on the optical wavefront in which the opposite phase variations caused by the temperature distributions in the correction plates 44, 54 do not compensate each other, but result in phase variations that have steeper gradients and higher amplitudes, for example, and/or can be changed more quickly than prior art devices. This will be explained in more detail in the following description of the function of the correction device 42 in section III.

In FIG. 4 it can also be seen that the two correction plates 44, 54 are connected to each other by small thermally isolating pins 88 that are distributed along the circumference and keep the correction plates 44, 54 apart. The first correction plate 44, and via the pins 88 also the second correction plate 54, is held and positioned in the recess 60 of the support frame 62 by circumferential adjustable mounts 90 in a similar manner as conventional lenses or other optical elements are mounted in the projection objective 20. As a matter of course, both correction plates 44, 54 may be mounted independently from each other so that the pins 88 may be dispensed with.

III. Function

In the following the function of the wavefront correction device 42 will be explained with reference to FIGS. 5 to 10.

Figures 5A, 5B:
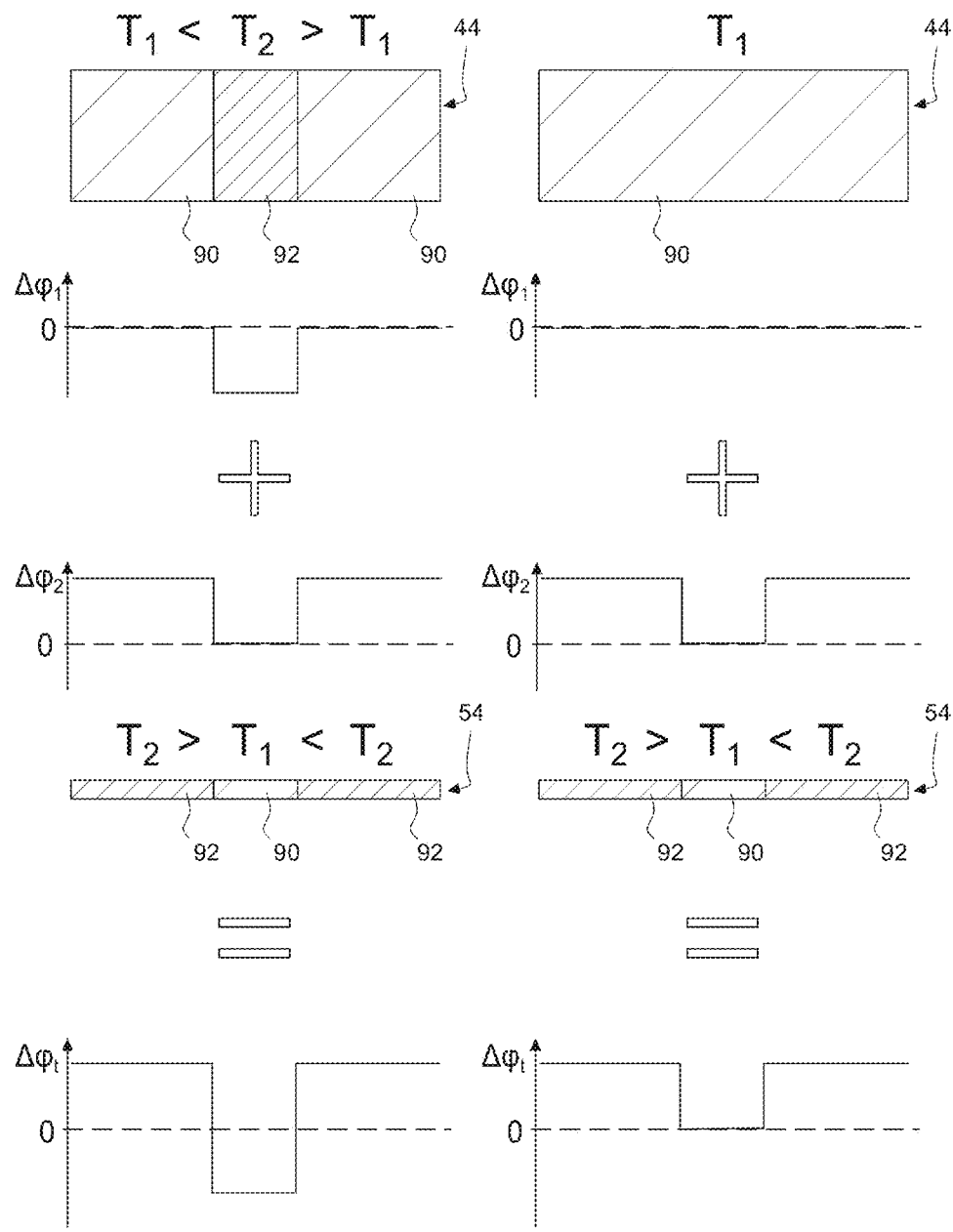
FIGS. 5a and 5b schematically illustrate exemplary stepped temperature distributions in two correction plates as well as generated phase variations at two different times, respectively.

FIG. 5a shows in its upper portion a schematic representation of a temperature distribution at a first time $t_1$ inside the first correction plate 44 made of fluorite and having a negative $dn_1/dT$. The areas 90 with a brighter hatching represent portions of the first correction plate 44 which have not been heated by the resistance wires 46. Therefore these portions, which will be referred to in the following as unheated portions 90, have an original temperature $T_1$ which is preferably equal to or less than an ambient temperature which prevails inside the projection objective 20.

The areas 92 with the darker hatching represent portions of the first correction plate 44 which have been heated by the resistance wires 46. Therefore these portions, which will be referred to in the following as heated portions 92, have an elevated temperature $T_2 > T_1$.

Here it is assumed that the heated portion 92 is a central portion of the first correction plate 44, and the unheated portion 902 surrounds the heated portion 92. As a matter of course, this illustration of the temperature distribution is highly schematic and does not reflect the continuous nature of real temperature distributions that are caused by effects such as heat transport and heat radiation.

Since the first correction plate is made of fluorite having a negative $dn_1/dT$, the positive temperature difference $\Delta T = T_2 - T_1$ implies that in the central heated portion 92 the refractive index $n_1$ is, unlike the situation in fused silica, smaller than in the surrounding unheated portion 90. Consequently, the phase variation $\Delta\phi_1$ is negative in the central heated portion 92 where the refractive index $n_1$ is smaller. This is illustrated in the graph below which shows the phase variation $\Delta\phi_1$ induced in an optical wavefront passing through the first correction plate 44. In this graph, and also in similar graphs elsewhere, the phase variation generated by the unheated portion 90 is set to zero.

The middle portion of FIG. 5a illustrates the temperature distribution that is produced in the second correction plate 54 at time $t_1$ with the help of the resistance wires 56 of the second heating device. It can be seen that the distribution of unheated portions 90 and heated portions 92 is complementary to the temperature distribution produced in the first correction plate 44. Complementary in this context means that, in contrast to the first correction plate 44, the unheated portion 90 is now the central portion, and the heated portion 92 surrounds the unheated portion 90.

Since the second correction plate 54 is made of fused silica having a positive $dn_2/dT$, this temperature distribution results in a distribution of the refractive index $n_2$ in which the surrounding heated portion has a higher refractive index $n_2$ than the central unheated portion 90. Therefore a positive phase variation $\Delta\phi_2$ is produced by the surrounding heated portion 92, as it is illustrated in the graph shown immediately above the second correction plate 54. But since, in relation to the surrounding heated portion 92, the phase in the central unheated portion 90 is less delayed, the overall effect of the second correction plate 54 on the optical wavefront is again, in relative terms, a retardation of the wavefront in the central unheated portion 90.

Thus both correction plates 44, 54 retard the wavefront in their central portions. If the first correction plate 44 is about 6.7 times thicker than the second correction plate 54, and assuming that the temperature change $\Delta T = T_2 - T_1$ is the same in both correction plates 44, 54, also the relative retardance in the central portions will be identical. Then the total effect on the wavefront produced by the combination of the correction plates 44, 54 will be a retardation in the central portion by an amount which is twice the amount that is generated by each individual correction plate 44, 54. This is shown in the bottom portion of FIG. 5a which illustrates the total phase variation $\Delta\phi_t = \Delta\phi_1 + \Delta\phi_2$.

FIG. 5b shows, in illustrations similar to FIG. 5a, the conditions that prevail at a later time $t_2 > t_1$.

Here it has been assumed that the heating of the portion 92 of the first correction plate 44 has been stopped so that, after a while, the original temperature $T_1$ prevails in the entire first correction plate 44. Consequently, the phase variation generated by the first correction plate 42 equals zero. The total phase variation $\Delta\phi_t$ is then exclusively given by the phase variation $\Delta\phi_2$ generated by the second correction plate 54 whose temperature distribution has been maintained.

As can be seen by comparing the graphs at the bottom portions of FIGS. 5a and 5b, the retardance of the wavefront in the central portion of the first pupil plane 36 has thus been reduced by a factor of 2. It is important to note that this change of the effect on the optical wavefront can be achieved very quickly, because the first correction plate 44 made of fluorite has a thermal conductivity which is approximately 9.71 $Wm^{-1}K^{-1}$. This is approximately seven times as large as the thermal conductivity of fused silica (1.38 $Wm^{-1}K^{-1}$).

Due to the significantly larger thermal conductivity, heat produced by the resistance wires 46 in the first correction plate 44 is conducted quickly to the circumferential surface and the lower surface of the first correction plate 44 which confines the gap 70 and is cooled by the fluid flow 72. This makes it possible to change the temperature distribution inside the first correction plate 44 in a time scale of a few minutes or even some seconds, depending, among others, on the thickness of the first correction plate 44. If the latter is relatively thick, as is the case in the embodiment shown, it may be envisaged to improve the heat transfer via the circumferential surface of the first plate 44 by establishing an immediate contact between the circumferential surface and a surrounding heat sink. For example, the circumferential surface may abut on bars made from copper or aluminum.

The ability of the correction device 42 to change quickly between different corrective effects on the optical wavefronts is very useful, because also the demand for the corrective effect sometimes changes very quickly. One reason for such a quickly changing demand is that different patterns 18 of structures 19 diffract the projection light into different directions. Consequently, also the irradiance distributions on lenses arranged in or in close proximity to pupil planes change quickly. These irradiance distributions may give rise to aberrations, particularly if the total irradiated area is small.

At least if the circumferential surface of the first plate 44 significantly contributes to the heat transport away from the first plate 44, such quick changes of the corrective effect could not be accomplished with the second correction plate 54 alone, because the thermal conductivity of fused silica is comparatively low, and therefore the temperature distributions do not change quickly enough. In this context it has also to be taken into account that the second correction plate 54 would need to be twice as thick to attain the same corrective effect if the first correction plate 44 was dispensed with.

FIGS. 6a and 6b show somewhat more realistic continuous temperature distributions in the first and second correction plates 44, 54 at different times $t_1$ and $t_2$, respectively. For the sake of simplicity it is assumed that the temperature distribution varies, along the direction shown, in a periodic manner. Therefore unheated portions 90 and heated portions 92 alternate in both correction plates 44, 54 periodically and continuously, as it is shown in the upper and middle portions of FIGS. 6a and 6b.

Referring first to FIG. 6a, it is assumed that the temperature distributions produced in the first and second correction plate 44, 54 are complementary to each other so that a light ray which passes through a point in the first correction plate 44, where the temperature is maximum, passes through a point in the second correction plate 54, where the temperature is minimum, and vice versa. In other words, the temperature distributions produced in the correction plates 44, 54 are displaced by half a period.

As a result of the opposite dependencies dn/dT, the generated phase variations $\Delta\phi_1$, $\Delta\phi_2$ overlap so that the total phase variation $\Delta\phi_t$ has twice the amplitude of the individual phase variations.

At time $t_2$ it is assumed that the temperature distribution in the first correction plate 44 is shifted by a quarter of a period, as it is shown in the top portion of FIG. 6b. Then minima of the phase variations $\Delta\phi_1$ produced by the first correction plate 42 coincide with maxima of the phase variations $\Delta\phi_2$ generated by the second correction plate 54. Due to this compensation the total phase variation $\Delta\phi_t$ becomes zero.

This illustrates that by merely shifting the temperature distribution inside the first correction plate 44 it is possible to quickly switch between large phase variations with steep phase gradients (see graph at bottom portion of FIG. 6a) and a zero corrective effect (see graph at bottom portion of FIG. 6b). This switching can be achieved very quickly due to the large thermal conductivity of the first correction plate 44.

Figures 7A, 7B:
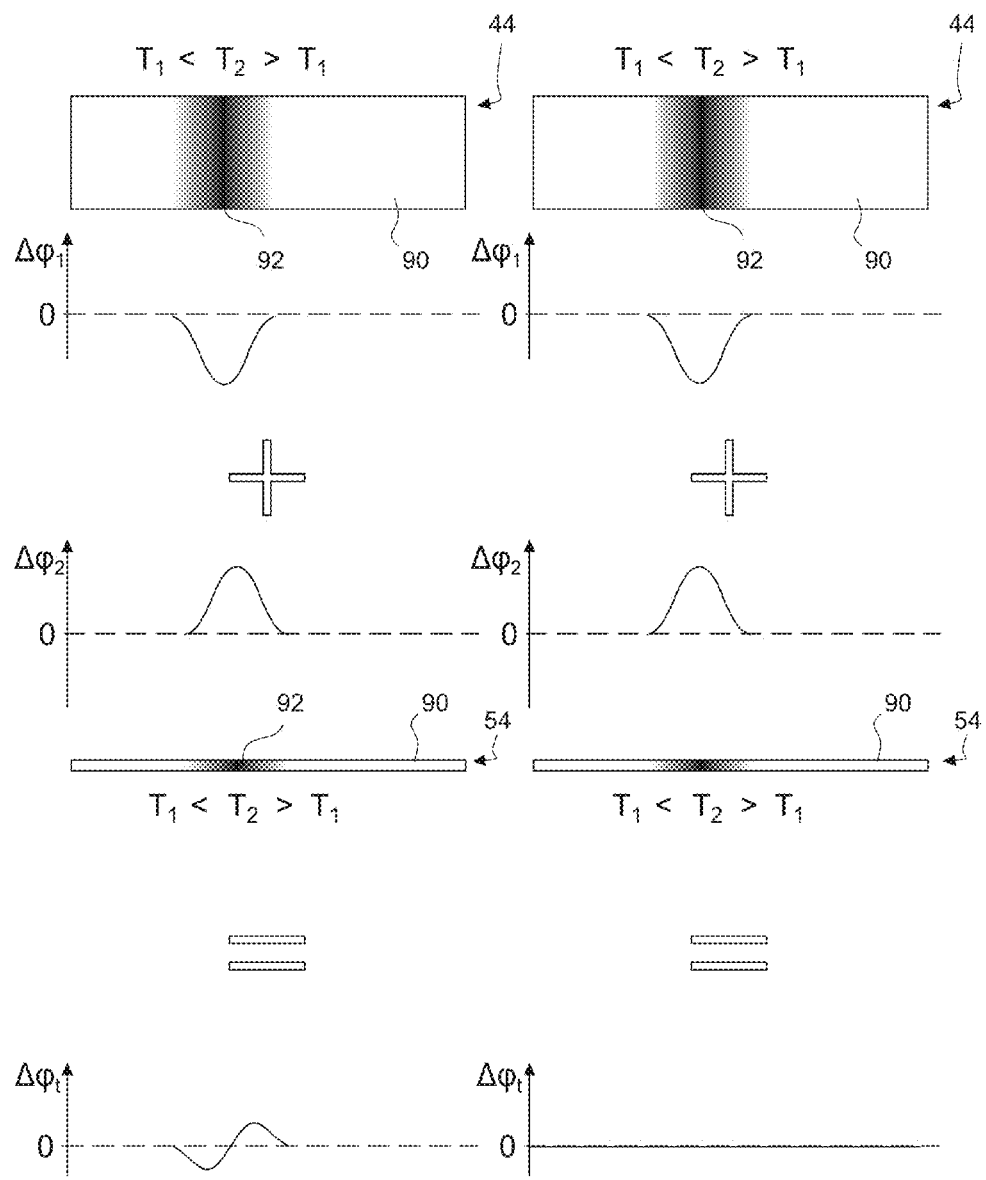
FIGS. 7a and 7b schematically illustrate exemplary continuous temperature distributions in the two correction plates as well as generated phase variations at two different times, respectively.

FIGS. 7a and 7b illustrate, in representations similar to FIGS. 6a and 6b, how the spatial frequency of the phase variations can be increased and quickly changed.

Here it is assumed that at a time $t_1$ the temperature distribution in the first correction plate 44 contains a single heated portion 92 from which the temperature decreases continuously to the unheated surrounding portion 90. The temperature distribution in the second correction plate 54 is selected so that it corresponds to the temperature distribution in the first correction plate 44, but is shifted by a small amount. This results in the total phase variation $\Delta\phi_t$ shown at the bottom portion of FIG. 7a having twice the spatial frequency of the temperature distributions produced in the correction plates 44, 54.

By slightly shifting the temperature distribution in the first correction plate 44 such that it perfectly coincides with the temperature distribution in the second correction plate 54, a complete compensation can be attained which results in a zero total phase variation $\Delta\phi_t$, as it is shown in the bottom portion of FIG. 7b. Thus it is possible to change very quickly between a phase variation with a very high spatial frequency (FIG. 7a) and a zero corrective effect (FIG. 7b) by merely shifting the temperature distribution inside the first correction plate 44 by a small amount.

In the following it will be explained with reference to FIGS. 8 and 9 how the different responses of the first and second correction plate 44, 54 to temperature changes may be used to adapt the corrective effect of the correction device 42 to changing illumination settings.

The control scheme explained in the following relies on the concept that the slowly reacting second correction plate 54 made of fused silica produces those phase variations which shall not be varied even if the illumination setting changes. On the other hand, the fast reacting first correction plate 44 made of fluorite generates only those phase variations that need to vary quickly each time the illumination setting is changed.

It is assumed that the illumination setting at a time $t_1$ corresponds to an irradiance distribution in the first pupil plane 36 as it is shown in FIG. 8a. In the first pupil plane 36 a central pole 100 and two poles 102, 104 are irradiated, with the outer poles 102, 104 being aligned along the X direction and spaced apart from the central pole 100 by equal distances.

FIG. 9a illustrates the illumination setting at a later time $t_2$ corresponding to an irradiance distribution in the first pupil plane 36 in which a central pole 100 is irradiated again, but the two other poles 102, 104 are now arranged along the Y direction. In other words, the central pole 100 is irradiated constantly, whereas the outer poles 102, 104 change their position each time the illumination setting is changed.

FIGS. 8b and 9b schematically illustrate the temperature distributions which are produced in the correction plates 44, 54 at times $t_1$ and $t_2$, respectively, in order to correct aberrations that are associated with the illumination settings shown in FIGS. 8a, 9a.

At the time $t_1$ the first correction plate 44 comprises two heated portions 90 whose positions correspond to the poles 102, 104 in the first pupil plane 36. Due to the negative dn/dT of the first correction plate 44, the refractive index $n_1$ in the heated portions 90 is smaller than in the surrounding unheated portion 92. This compensates the retardance which is produced by the lenses L1, L2. These lenses are exposed to similar irradiance distributions as they are shown in FIG. 8a, because the lenses L1, L2 are arranged in close proximity to the first pupil plane 36.

On the other hand, the retardance associated with the central pole 100 is exclusively compensated for by the second correction plate 54. To this end a temperature distribution is produced in the second correction plate 54 in which a heated portion 92 surrounds a central unheated portion 90.

If the illumination setting is changed from the X dipole setting shown in FIG. 8a to the Y dipole setting shown in FIG. 9a, the temperature distribution in the second correction plate 54 is maintained unamended, because the central pole 100 has not changed its position. However, the outer poles 102, 104 are now aligned along the Y direction, and consequently the temperature distribution inside the first correction plate 44 has to be rotated by 90°, too. At least if the circumferential surface of the first plate 44 significantly contributes to the heat transport away from the first plate 44, this can be accomplished very quickly because of the large thermal conductivity of the first correction plate 44.

Again, the combination of the first correction plate 44 made of a material with a negative dn/dT and the second correction plate 54 having a positive dn/dT makes it possible to quickly change the corrective effect of the correction device 42, which is important if the illumination setting changes quickly during the operation of the projection exposure apparatus 10.

Compared to an approach in which only a single correction plate made of fluorite was used, the combination of two correction plates 44, 54 having an opposite dn/dT has the advantage that the stronger temperature sensitivity of the refractive index (i.e. the larger absolute value of dn/dT) of fused silica can be used to produce a strong corrective effect even for small temperature changes and thin correction plates. Thus one might say that the second correction plate 54 made of fused silica takes over the base load, whereas the first correction plate 44 made of fluorite takes over the remaining corrective effect that changes quickly.

Furthermore, not only the large thermal conductivity, but also the negative dn/dT contributes to the quick response time of the first correction plate 44. This is because only two small areas on the upper surface of the first correction plate 44 have to be heated up by the resistance wires 46 for generating the desired corrective effect on the optical wavefront. The small volume to be heated makes it possible to dissipate the heat very quickly.

In contrast, if the first correction plate 44 was assumed to be also made of fused silica, almost its entire surface would need to be heated up by the resistance wires. This would not only increase the total amount of heat which is produced by the correction device 42, but would make it more difficult to quickly change the temperature distribution inside the first correction plate 44.

IV. Correction Method

In the following various aspects how the correction device 42 may be used to correct wavefront deformations will be summarized.

In a first step an aberration of the projection objective 20 is determined. This can be done either by measurements and/or by simulation. Simulation may be performed on the basis of experimental data and has the advantage that the operation of the projection exposure apparatus does not have to be disrupted to perform measurements of the image quality, for example. Simulation will usually be involved also if image enhancement technologies are applied. Determining an aberration by measurement, on the other hand, may be necessary if the aberration shall be determined with the highest possible accuracy. For measuring the aberration an optical wavefront measuring device 110, for example a Fizeau interferometer, may be inserted into the image plane 30 of the projection objective 20, as this is indicated in FIG. 2 by an arrow 112.

Also a mixed approach, which uses certain measurements as well as simulations, may be used to quickly and accurately determine the aberration. For example, an ideal non-planar wavefront may be computed using image enhancement technologies, and the real optical wavefront is measured.

In a next step the corrective effect which is required to obtain the desired optical wavefront has to be determined. This step may also take into account that not only the corrective device 42, but also other correction systems, for example the manipulators M1, M2 which are configured to displace the lenses L1, L2 along the optical axis OA, are available to reduce the aberration. One approach is to consider all available correction systems in a common optimization process. Singular value decomposition (SVD) or Tikhonov regularization may be used in this respect. Another approach based on Convex Programming is described in WO 2010/034674 A1. In such an optimization process the first and second correction plates 44, 54 are considered as independent correction systems, but the different temporal behavior resulting from the different thermal conductivity should be taken into account.

The optimization process yields a first phase variation which is to be generated by the first correction plate 44, and a second phase variation which is to be generated by the second correction plate 54. If the projection objective 20 comprises other corrective components such as the manipulators M1, M2, the first and second phase generation may modify the aberration determined before so that other corrective components are able to modify the aberration still further so that the desired optical wavefront is obtained. In the case of conventional image errors the effect of the first and second phase variations usually, but not necessarily, involves that the optical wavefront is symmetrized. This means that the wavefront deformation is at least substantially rotationally symmetric. This, in turn, implies that the coefficients of higher order Zernike polynomials at least substantially vanish. If image enhancement technologies are applied, the first and second phase variations will, optionally together with phase variations produced by other corrective components, modify the optical wavefront such that the ideal non-planar optical wavefront is obtained.

Then an algorithm computes the temperature distributions which are required in the first and second correction plates 44, 54 to generate the first and second phase variations, respectively. In a next step it has to be determined which voltages have to be applied to the resistance wires 46, 56. This again may be achieved by using an optimization process, because each resistance wire 46, 56 may be considered as a single correction component. More details regarding the computation and production of temperature distributions in refractive optical elements are described in the aforementioned unpublished patent application PCT/EP2011/004859 (Zellner et al).

Finally, the control unit 68 controls the electronic circuit boards 64 so that they apply, via the flexible leads 65, those voltages to the resistance wires 46, 56 that are needed to produce the temperature distributions in the correction plates 44, 54 which have been computed before.

Figure 10:
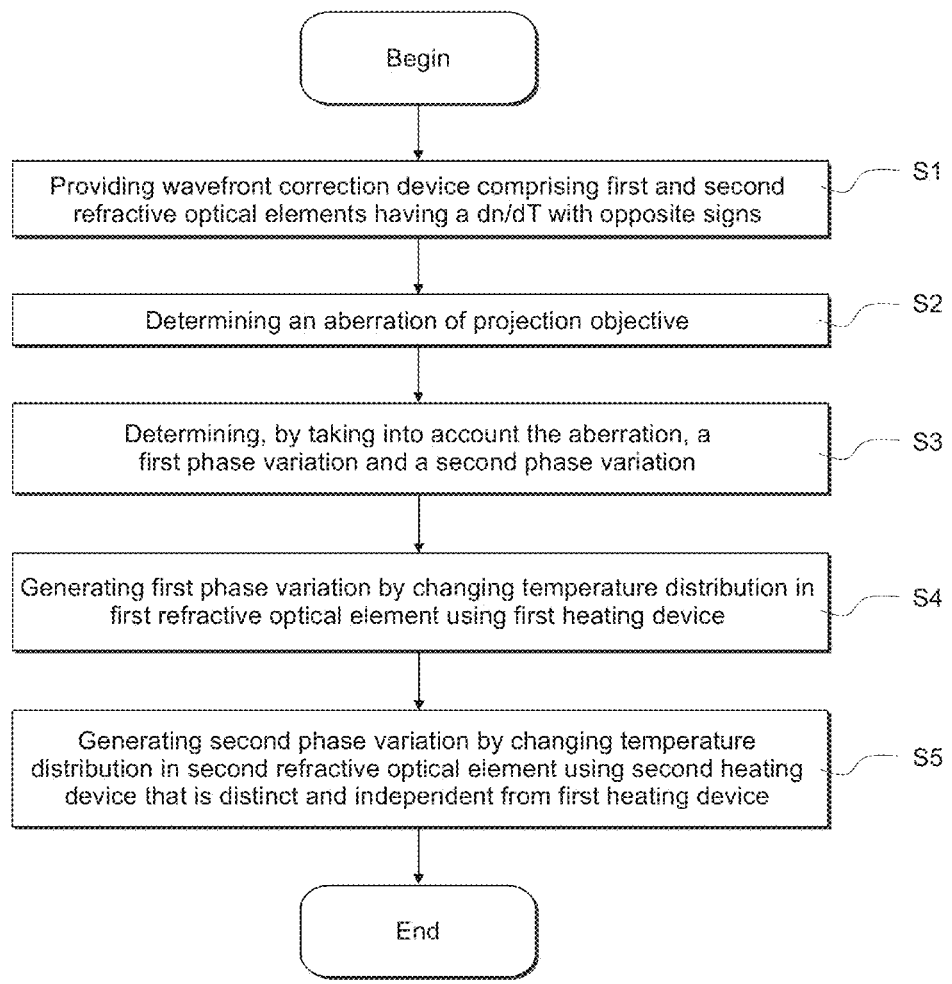
FIG. 10 is a flow diagram illustrating important method steps.

FIG. 10 is a flow diagram which summarizes important aspects of a method of operating a microlithographic projection exposure apparatus in accordance with the present invention.

In a first step S1, a wavefront correction device is provided comprising first and second refractive optical elements having a dn/dT with opposite signs.

In a second step S2 an aberration of a projection objective is determined.

In a third step S3 a first phase variation and a second phase variation are determined by taking into account the aberration.

In a fourth step S4 the first phase variation is generated by changing the temperature distribution in the first refractive optical element using a first heating device.

In a fifth step S5 the second phase variation is generated by changing the temperature distribution in the second refractive optical element using a second heating device that is distinct and independent from the first heating device.

V. Alternative Embodiments

Figure 11:
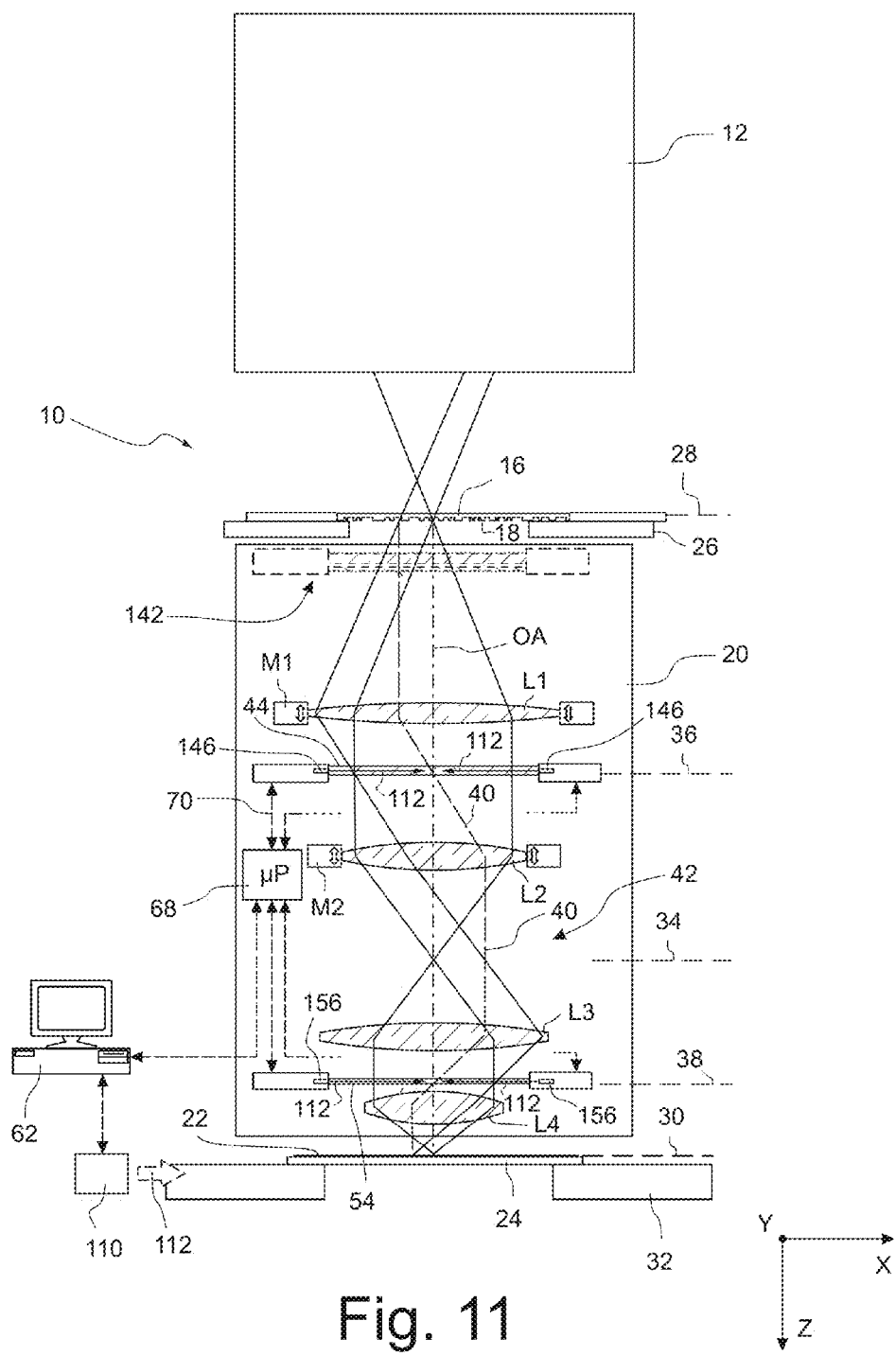
FIG. 11 is a schematic meridional section through the apparatus shown in FIG. 1 according to an alternative embodiment in which the correction plates are arranged at different optically conjugate planes.

FIG. 11 illustrates, in a meridional section similar to FIG. 2, a second embodiment of a projection exposure apparatus 10 in which the two correction plates 44, 54 are not arranged immediately adjacent to one another in or in close proximity to the first pupil plane 36, but further away from each other so that a plurality of optical elements, here the lenses L2 and L3, are arranged between the correction plates 44, 54.

More specifically, the first correction plate 44 made of fluorite is still arranged in the first pupil plane 36. The second correction plate made of fused silica, however, is arranged in the second pupil plane 38 which is optically conjugate to the first pupil plane 36.

Arranging the correction plates 44, 54 at different, but optically conjugate planes may be advantageous with respect to space requirements in the projection objective 20. Furthermore, problems associated with thermally isolating the two correction plates 44, 54 are considerably reduced.

Additionally, the correction plates 44, 54 are not heated by resistances wires, but by light sources 146, 156, for example LEDs or laser diodes, that emit heating light 112 which is coupled into the plates 44, 54 via their circumferential surface. More details with regard to this manner of producing a temperature distribution inside a refractive optical element are described in the above mentioned unpublished international patent application PCT/EP2011/004859 (Zellner et al).

Alternatively or additionally, a correction device 142 in accordance with the present invention and indicated with broken lines may be arranged in close proximity to the object plane 28 of the projection objective 20. In such a position the correction device 142 may be used to correct distortion or other field dependent aberrations. Needless to say, it is also possible to arrange only one of the correction plates 44, 54 in the vicinity of the object plane 28 and the other correction plate at an optically conjugate position, for example in the vicinity of the intermediate image plane 34. It is also possible to arrange both plates 44, 54 in intermediate axial positions, i.e. neither in pupil nor in field planes, as long as these intermediate positions are at least approximately optically conjugate.

It should also be noted that, as a matter of course, the sequence of the first and second correction plate 44, 54 may be reversed. Furthermore, a correction device may also comprise more than one correction plate having a negative dn/dT and more than one correction plate

The invention claimed is:

1. A method, comprising:
providing a projection objective which comprises a wavefront correction device, the wavefront correction device comprising:
a first refractive optical element comprising a first optical material having, for an operating wavelength of the projection exposure apparatus, an index of refraction that decreases with increasing temperature; and
a second refractive optical element comprising a second optical material having, for the operating wavelength of the projection exposure apparatus, an index of refraction that increases with increasing temperature,
determining an aberration of the projection objective via measurement and/or simulation;
determining, by taking into account the aberration, a first phase variation and a second phase variation, wherein, if the first phase variation is generated by the first refractive optical element and the second phase variation is generated by the second refractive optical element, the determined aberration is modified;
generating the first phase variation by changing a temperature distribution in the first optical material using a first heating device; and
generating the second phase variation by changing a temperature distribution in the second optical material using a second heating device that is distinct and independent from the first heating device.

2. The method of any claim 1, further comprising:
after d), obtaining a first temperature distribution in the first optical material; and
after e), obtaining a second temperature distribution in the second optical material.

3. The method of claim 2, wherein both the first and second temperature distributions are non-uniform.

4. The method of claim 3, wherein both the first and second temperature distributions are describable by a superposition of Zernike polynomials containing at least one term $Z_i$ with $i \geq 5$.

5. The method of claim 2, wherein the first temperature distribution differs from the second temperature distribution.

6. The method of claim 5, wherein the first temperature distribution is at least substantially complementary to the second temperature distribution.

7. The method of claim 1, wherein the first refractive optical element is arranged immediately adjacent to the second refractive optical element.

8. The method of claim 7, further comprising guiding an at least substantially laminar fluid flow through an interspace delimited by the first and second refractive optical elements.

9. The method of claim 1, wherein a solid optical element is between the first and second refractive optical elements.

10. The method of claim 9, wherein the first refractive optical element is arranged at a position that is at least substantially optically conjugate to a position where the second refractive optical element is arranged.

11. An objective, comprising:
a wavefront correction device, comprising:
a first refractive optical element comprising a first optical material which has, for an operating wavelength of the objective, an index of refraction that decreases with increasing temperature;
a second refractive optical element comprising a second optical material which has, for the operating wavelength of the apparatus, an index of refraction that increases with increasing temperature;
a first heating device configured to produce a non-uniform and variable temperature distribution in the first optical material; and
a second heating device configured to produce a non-uniform and variable temperature distribution in the second optical material,
wherein the objective is a microlithographic projection objective.

12. The objective of claim 11, wherein the first heating device comprises a plurality of heating elements which are individually controllable via a control unit, and the second heating device each comprises a plurality of heating elements which are individually controllable via a control unit.

13. The objective of claim 12, wherein each heating element of at least one of the heating devices comprises an electric heat dissipating member.

14. The objective of claim 12, wherein each heating element of at least one of the heating devices comprises a heating light source.

15. The objective of claim 11, further comprising a solid optical element between the first and second refractive optical elements.

16. The objective of claim 15, wherein the first refractive optical element is arranged at a position that is at least substantially optically conjugate to a position where the second refractive optical element is arranged.

17. The objective of claim 11, wherein:
the first refractive optical element comprises a plate having a uniform thickness d1;
the second refractive optical element comprises a plate having a uniform thickness d2;
the index of refraction of the first optical material decreases, for the operating wavelength of the objective and a temperature range between 20° and 100°, with increasing temperature by dn1/dT;
the index of refraction of the second optical material increases, for the operating wavelength of the objective and a temperature range between 20° and 100°, with increasing temperature by dn2/dT;

$(-dn1/dT)/(dn2/dT) = k \cdot d2/d1$; and $0.9 < k < 1.1$.

18. The objective of claim 17, wherein the first refractive optical element comprise $CaF_2$, the second refractive optical element comprises $SiO_2$, and the first refractive optical element is between 6.1 and 7.3 times thicker than the second refractive optical element.

19. An apparatus, comprising:
an illumination system; and
the objective of claim 11,
wherein the apparatus is a microlithograhic projection exposure apparatus.

20. A method, comprising:
providing a projection objective which comprises a wavefront correction device, the wavefront correction device comprising:
  a first refractive optical element comprising a first optical material having, for an operating wavelength of the projection exposure apparatus, an index of refraction that decreases with increasing temperature; and
  a second refractive optical element comprising a second optical material having, for the operating wavelength of the projection exposure apparatus, an index of refraction that increases with increasing temperature,
determining an aberration of the projection objective via measurement and/or simulation, the aberration comprising a first phase variation and a second phase variation; and
modifying the aberration by:
  generating the first phase variation by changing a temperature distribution in the first optical material using a first heating device; and
  generating the second phase variation by changing a temperature distribution in the second optical material using a second heating device that is distinct and independent from the first heating device.

* * * * *

UNITED STATES PATENT AND TRADEMARK OFFICE
CERTIFICATE OF CORRECTION

PATENT NO. : 9,164,402 B2
APPLICATION NO. : 14/327919
DATED : October 20, 2015
INVENTOR(S) : Holger Walter and Boris Bittner Page 1 of 1

It is certified that error appears in the above-identified patent and that said Letters Patent is hereby corrected as shown below:

In the specification

Col. 5, line 2, before "projection", insert -- the --.

Col. 14, line 3, delete "$\Delta\varphi_1 = \Delta\varphi_1 + \Delta\varphi_2$." and insert -- $\Delta\varphi_t = \Delta\varphi_1 + \Delta\varphi_2$. --.

Col. 19, line 19, delete "plate" and insert -- plate. --.

In the claims

Col. 19, line 49, Claim 2, after "of", delete "any".

Col. 20, line 65, Claim 18, delete "$SiO_2$,," and insert -- $SiO_2$, --.

Col. 21, line 4, Claim 19, delete "microlithograhic" and insert -- microlithographic --.

Signed and Sealed this
Fifteenth Day of March, 2016

Michelle K. Lee
*Director of the United States Patent and Trademark Office*